US 8,881,928 B2
(12) United States Patent
Sakamoto et al.

(10) Patent No.: US 8,881,928 B2
(45) Date of Patent: Nov. 11, 2014

(54) CASING COVER

(75) Inventors: Yusuke Sakamoto, Toyota (JP); Kenjiro Shiba, Takahama (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/637,164

(22) PCT Filed: Nov. 25, 2010

(86) PCT No.: PCT/JP2010/071055
§ 371 (c)(1),
(2), (4) Date: Sep. 25, 2012

(87) PCT Pub. No.: WO2012/070140
PCT Pub. Date: May 31, 2012

(65) Prior Publication Data
US 2013/0008903 A1  Jan. 10, 2013

(51) Int. Cl.
*B65D 51/18* (2006.01)
*H05K 7/14* (2006.01)

(52) U.S. Cl.
CPC .................................. *H05K 7/1432* (2013.01)
USPC ........... 220/255; 220/241; 220/242; 220/4.02

(58) Field of Classification Search
CPC .... Y10S 220/13; Y10S 248/906; H01M 2/04; H01M 2/0456; H05K 7/00; H05K 7/1432; H05K 5/03; B29C 66/12411; B29L 2031/772; B29L 2031/7722; G11B 33/0727; Y01H 9/0264; B60R 16/04; B64D 2585/6875; B65D 25/36; H01R 13/52; H60R 16/02; H02G 3/14; H02G 3/08; H02G 3/02; H02G 3/088

USPC ......... 220/255, 213, 40, 244, 816, 4.02, 3.94, 220/3.92, 3.9, 3.8, 212.5, 318, 241, 242; 429/65; 361/837; 174/562, 561, 560, 174/559, 537, 67; 206/822; 307/10.7; 439/718

See application file for complete search history.

(56) References Cited

U.S. PATENT DOCUMENTS 2,727,966 A * 12/1955 Reichert et al. ............... 200/304
3,048,747 A *  8/1962 Errichiello .................... 361/730

(Continued)

FOREIGN PATENT DOCUMENTS

JP        2-257178 U    2/1990
JP     2002-141991 A    5/2002
JP     2006-014577 A    1/2006

(Continued)

OTHER PUBLICATIONS

International Search Report mailed Dec. 21, 2010 of PCT/JP2010/071055.

*Primary Examiner* — Andrew Perreault
*Assistant Examiner* — James M Van Buskirk
(74) *Attorney, Agent, or Firm* — Kenyon & Kenyon LLP

(57) ABSTRACT

Provided is a casing cover able to conform to the dimensional tolerance in a difference between levels of the casing. The casing cover has an upper level cover which covers two openings in the upper level of the casing and a lower level cover which covers an opening in a lower level of the casing. Furthermore, among the upper level cover and the lower level cover: one is formed with an insertion opening passing therethrough in the direction of the height of the difference in levels; and the other is provided with a guide fitting formed to a length in the direction of the height of the difference in levels, which is longer than the maximum allowable dimension of the height of the difference between levels plus a value, and inserted into the insertion opening. In addition, for purposes of preventing the guide fitting, which connects the upper level cover and the lower level cover, from slipping out of the insertion opening, a connection fitting is provided.

3 Claims, 12 Drawing Sheets

(56) References Cited

U.S. PATENT DOCUMENTS

| | | | | |
|---|---|---|---|---|
| 4,774,390 | A * | 9/1988 | Lehman et al. | 200/304 |
| 6,033,252 | A * | 3/2000 | Hood et al. | 439/374 |
| 7,410,020 | B2 | 8/2008 | Kikuchi et al. | |
| 2005/0237147 | A1 * | 10/2005 | Carreras | 337/186 |
| 2009/0001291 | A1 | 1/2009 | Rouh | |

FOREIGN PATENT DOCUMENTS

| | | |
|---|---|---|
| JP | 2008-279973 A | 11/2008 |
| JP | 2009-056992 A | 3/2009 |

* cited by examiner

CASING COVER

This is a 371 national phase application of PCT/JP2010/071055 filed 25 Nov. 2010, the contents of which are incorporated herein by reference.

TECHNICAL FIELD

The present invention relates to a casing cover.

BACKGROUND ART

In a vehicle provided with a high-voltage device and the like, the high-voltage device is contained in a casing 100 as shown in FIG. 8, in order to protect the high-voltage device and prevent a worker who performs maintenance and inspection, etc. of the vehicle from coming into contact with the high-voltage device. A plurality of openings are made in the walls of the casing 100. These openings include cable insertion openings 104 into which cables 102 to be connected to an input terminal and an output terminal of the high-voltage device are inserted, and tool insertion openings 106 into which a tool is inserted in order to fix a cable terminal 103 to the input terminal or the output terminal of the high-voltage device using fastener members such as screws.

As shown in FIG. 8 and Patent Literature 1, tool insertion openings 106 are covered by a protection cover which is referred to as a terminal cover 108. The terminal cover 108 is a plate-like member having a shape corresponding to the arrangement of the tool insertion openings 106 and is fixed to a wall surface 110 by fastener members such as screws. In order to perform the operation of attaching and removing the cable terminal 103 to/from an input terminal and an output terminal of the high-voltage device, the terminal cover 108 is first removed from the casing 100 to thereby expose the tool insertion openings 106, and the tool is then inserted into the insertion openings 106.

CITATION LIST

Patent Literature

[Patent Literature 1] JP 2008-279973 A

SUMMARY OF INVENTION

Technical Problem

In recent years, in order to fulfill the demand for miniaturization of a casing, there has been developed a casing 122 in which the wall surface in which the tool insertion openings 106 are made is shaped in a step form having an upper step surface 118 and a lower step surface 120, as shown in FIG. 9. Because the tool insertion openings 106 are provided on both the upper step surface 118 and the lower step surface 120, both surfaces need to be covered by the terminal cover. Therefore, as shown in FIG. 10, it may be possible to cover the upper step surface 118 and the lower step surface 120 by a terminal cover 126 having a step portion 124 having a height equal to a design value L0 of the step height between the upper step surface 118 and the lower step surface 120.

Here, for the step height of the casing 122, a maximum permissible size value and a minimum permissible size value having predetermined widths from the designed value L0 are determined, and steps on individual casings 122 may have a value between a maximum permissible size value and a minimum permissible size value. FIG. 11 shows that the terminal cover 126 is attached to the casing 122 having the step height that is the minimum permissible size value. In this case, the upper step portion 128 of the terminal cover 126 comes off the upper step surface 118 of the casing 122. Meanwhile, as shown in FIG. 12, when the terminal cover 126 is attached to the casing 122 having the step height that is the maximum permissible size value, the lower step portion 130 of the terminal cover 126 comes off the lower step surface 120 of the casing 122. As such, there are cases where, if the step height of the terminal cover is fixed, the terminal cover cannot accommodate the dimensional tolerance of the step on the casing 122, resulting in insufficient shielding of the tool insertion openings 106.

Therefore, the purpose of the present invention is to provide a casing cover that can accommodate the dimensional tolerance of the step on the casing.

Solution to Problem

The present invention relates to a cover that covers openings of a casing. A step is formed on the casing, and openings are formed in the upper step surface and the lower step surface connected to each other by the step. The cover is provided with an upper step cover for covering the opening in the upper step surface and a lower step cover for covering the openings in the lower step surface. An insertion opening penetrating in the step height direction is formed in one of the upper step cover and the lower step cover, while a guiding member configured to be inserted into the insertion opening and have a length in the step height direction longer than the maximum permissible size value of the step height is provided in another one of the upper step cover and the lower step cover. In addition, there is also provided a connecting member which connects the upper step cover to the lower step cover to thereby prevent the guiding member from falling out from the insertion opening.

It is also preferable in the above invention for the opening shape of the insertion opening to be noncircular, and for the guiding member to have a cross-sectional shape in a direction perpendicular to the step height direction that corresponds to the opening shape.

It is further preferable in the above invention for a second insertion opening penetrating in the step height direction to be formed in one of the upper step cover and the lower step cover, and for a detent pin that is to be inserted into the second insertion opening to be provided at a position on the casing corresponding to the second insertion opening.

Advantageous Effect of Invention

With a casing cover according to the present invention, it is possible to accommodate the dimensional tolerance of the step on the casing.

DESCRIPTION OF EMBODIMENTS

Figure 1:
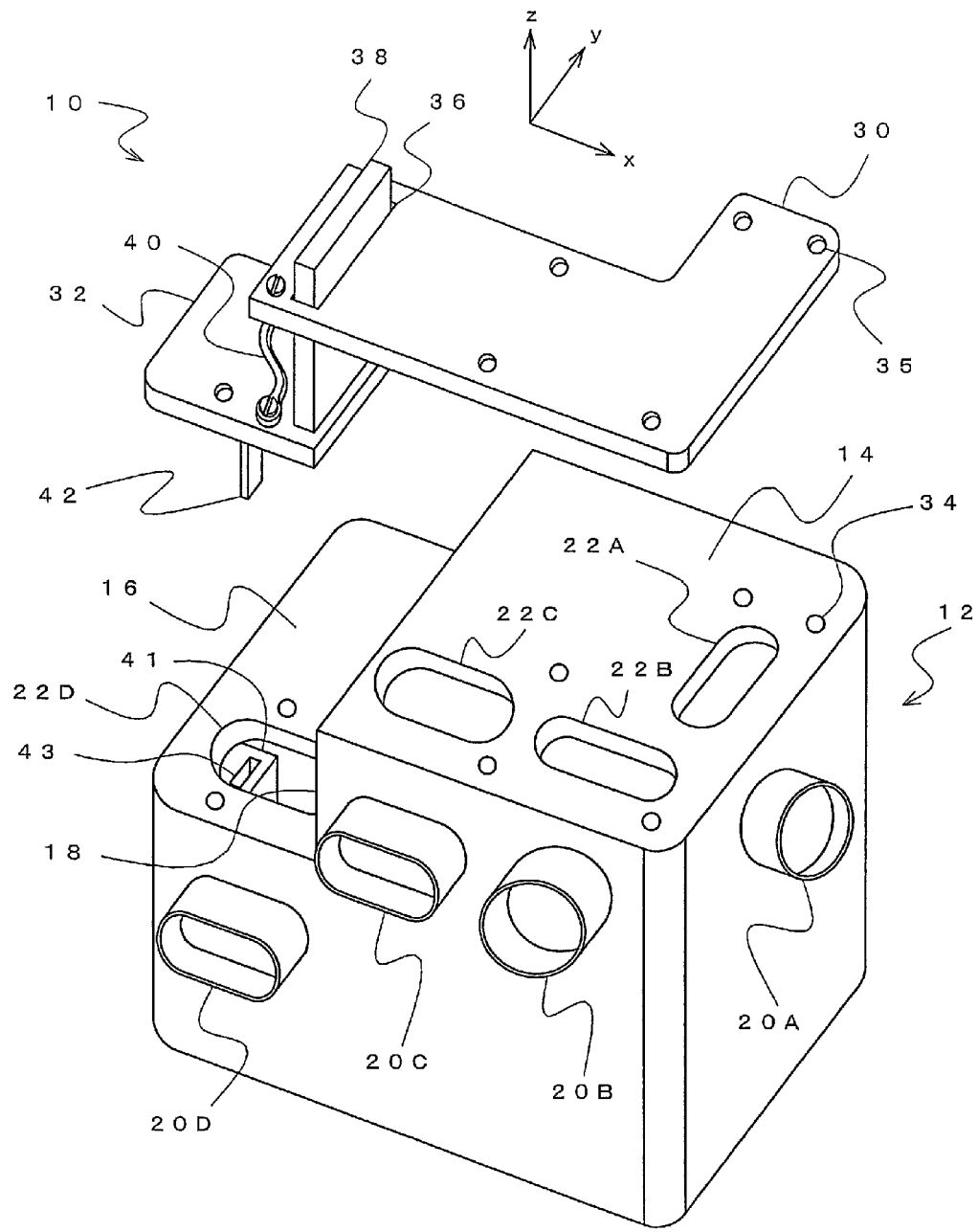
FIG. 1 shows an example of a terminal cover according to the present embodiment.

A terminal cover 10 according to the present embodiment is attached to a casing 12 as shown in FIG. 1. The casing 12 is a hollow housing, and a high-voltage device (not shown) is contained in the casing 12. The casing 12 is composed of components having mechanical strength that can protect the high-voltage device, and is made of, for example, a metallic material such as aluminum. The casing 12 also supports the high-voltage device through an insulated material and has a structure that is not electrically connected to the high-voltage device even if the high-voltage device contacts with the casing 12. The casing 12 and the high-voltage device are mounted on a vehicle having, for example, a rotating electrical machine as a drive source. The high-voltage device includes, for example, a DC/DC converter boosting DC power of a battery and an inverter converting the DC power obtained after boosting to AC power.

The casing 12 also has a step shape, and an upper step surface 14 is connected to a lower step surface 16 by a step surface 18. Although, in FIG. 1, the step is formed on the top surface of the casing 12, it may be formed on the side surface or the bottom surface.

A limit of size is determined for the step height between the upper step surface 14 and the lower step surface 16 (the length in the z direction in FIG. 1). That is, assuming that a dimensional tolerance is 2d, a maximum permissible size value L0+d and a minimum permissible size value L0−d are determined with respect to a design value L0 of the step height. If the step obtained when the casing 12 is manufactured is equal to or greater than the minimum permissible size value and equal to or smaller than the maximum permissible size value, the casing 12 is treated as an eligible article, while if the step is out of this range, the casing 12 is treated as an ineligible article. In other words, the step height of individual casings 12 may have a value between the minimum permissible size value L0−d and the maximum permissible size value L0+d. The maximum permissible size value L0+d and the minimum permissible size value L0−d may be obtained from a general tolerance.

On the side surface of the casing 12, there are provided cable insertion openings 20A to 20D through which cable terminals are inserted into an input terminal and an output terminal of the high-voltage device (not shown) contained in the casing 12. In the embodiment shown in FIG. 1, the tool insertion openings 22A to 22C are made in the upper step surface 14, while the tool insertion opening 22D is made in the lower step surface 16.

The input terminal or the output terminal of the high-voltage device is fixed to the cable terminal with a fastener member such as a screw. For example, screw holes of the input terminal and the output terminal are aligned with screw holes in the cable terminals and are fastened with screws. A fastening tool such as a driver is inserted into the tool insertion openings 22A to 22D for fixation.

The terminal cover 10 according to the present embodiment is configured to close the tool insertion opening 22A to 22D. That is, the terminal cover 10 is configured to have an upper step cover 30 which closes the tool insertion openings 22A to 22C in the upper step surface 14 of the casing 12 and a lower step cover 32 which closes the tool insertion opening 22D in the lower step surface 16 of the casing 12. The upper step cover 30 and the lower step cover 32 are composed of components mechanically strong enough not to bend even when the operator or the like applies a load, and are made of, for example, a metallic material such as aluminum.

The upper step cover 30 is configured as a plate-like member having a shape corresponding to the arrangement of the tool insertion openings 22A to 22C, while the lower step cover 32 is configured as a plate-like member having a shape corresponding to the arrangement of the tool insertion opening 22D. For example, in FIG. 1, because the tool insertion openings 22A to 22C are arranged in an L shape in the upper step surface 14, the upper step cover 30 is also in an L shape. Further, fixing holes 35 are provided in the upper step cover 30 and the lower step cover 32 at positions corresponding to fixing holes 34 provided in the upper step surface 14 and the lower step surface 16 of the casing 12. In order to fix the upper step cover 30 to the upper step surface 14 and fix the lower step cover 32 to the lower step surface 16, the fixing holes 35 of both covers are aligned with the fixing holes 34 of the both step surfaces, and then they are fixed using fastener members such as screws.

Further, the lower step cover 32 is provided with an interlock key 42. The interlock key 42 can be inserted into a key insertion opening 43 formed, in an interlocking device 41 provided in the casing 12, at a position corresponding to the tool insertion opening 22D. When the interlock key 42 is pulled out from the key insertion opening 43, the interlocking device 41 cuts off power supply to the high-voltage device in the casing 12. Specifically, a system main relay on a wire connecting the battery to the high-voltage device is switched from a connecting state to a disconnecting state. Although, in the embodiment shown in FIG. 1, the interlock key 42 is provided on the lower step cover 32, this embodiment is not limiting. In short, the interlock key 42 only has to be provided at a position corresponding to the key insertion opening 43. For example, the key insertion opening 43 may be provided in one of the tool insertion openings 22A to 22C, and the interlock key 42 may be provided in the upper step cover 30 at a position corresponding to the tool insertion opening in which the key insertion opening 43 is provided.

In addition, the upper step cover 30 is provided with an insertion opening 36 penetrating in the step height direction (Z axis direction in FIG. 1). Meanwhile, the lower step cover 32 is provided with a guiding member 38 to be inserted into the insertion opening 36. The guiding member 38 is composed of a component mechanically strong enough not to bend even when the operator or the like applies a load, and is made of, for example, a metallic material such as aluminum. Further, the guiding member 38 may be integrally formed with the upper step cover 30. The guiding member 38 may be fixed to the upper step cover 30 as a separate component by welding, etc.

Figure 2:
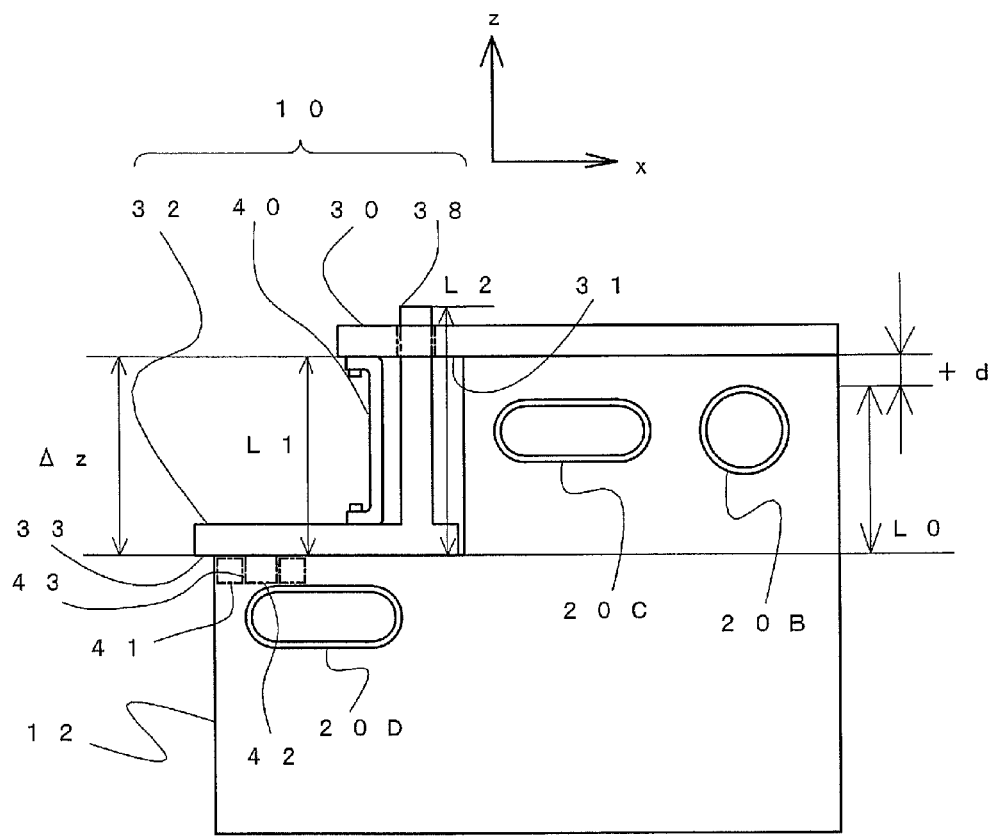
FIG. 2 shows the terminal cover according to the present embodiment which is attached to the casing.

The guiding member 38 extends from the lower step cover 32 in the step height direction and is configured so that the length L2 in the step height direction is greater than the maximum permissible size value L0+d of the step height of the casing 12 (L2>L0+d), as shown in FIG. 2. Here, it is assumed that the height L2 of the guiding member 38 in the step direction indicates the height from a bottom surface 33 of the lower step cover 32. Further, a cross sectional shape of the guiding member 38 in a direction perpendicular to the step height direction (x-y plane in FIG. 1) corresponds to the shape of the insertion opening 36. In FIG. 1, the cross-sectional shape of the insertion opening 36 and the guiding member 38 is rectangular.

A narrow gap is provided between the insertion opening 36 and the guiding member 38 so that the guiding member 38 inserted into the insertion opening 36 is not fixed to the upper step cover 30. Further, the upper step cover 30 is slidable along the guiding member 38 in the step height direction. As a result, it is possible to adjust a relative distance $\Delta z$ between the upper step cover 30 and the lower step cover 32 in the step direction. Here, the relative distance $\Delta z$ indicates a relative distance between the bottom surface 33 of the lower step cover 32 and a bottom surface 31 of the upper step cover 30 in the step height direction (z axis direction).

Further, the upper step cover 30 and the lower step cover 32 are connected by a connecting member 40. The connecting member 40 is composed of a component that can connect the upper step cover 30 and the lower step cover 32 even if the relative distance $\Delta z$ changes, and is made of a flexible material such as a resin. The connecting member 40 is fixed to the upper step cover 30 and the lower step cover 32 by, for example, fastener members such as screws.

As shown in FIG. 2, the connecting member 40 is configured so that the maximum length L1 in the step height direction is shorter than the length L2 of the guiding member 38 in the step height direction (L1<L2). Here, it is assumed that the maximum length L1 of the connecting member 40 indicates the length from the bottom surface 33 of the lowest step cover 32 (surface in contact with the lower step surface 16) to the bottom surface 31 of the upper step cover 30 (surface in contact with the upper step surface 14) when the connecting member 40 is dragged in the step height direction. By making the maximum length L1 of the connecting member 40 shorter than the height L2 of the guiding member 38, it is possible to prevent the guiding member 38 from falling out from the insertion opening 36.

The connecting member 40 also serves to determine an upper limit of the relative distance $\Delta z$ between the upper step cover 30 and the lower step cover 32. That is, the upper step cover 30 and the lower step cover 32 cannot be separated from each other further than the maximum length L1 of the connecting member 40. In this regard, it is preferable that the maximum length L1 of the connecting member 40 is equal to or longer than the length of the maximum permissible size value L0+d of the step height (L1≥L0+d). In doing so, it is possible to adjust the relative distance $\Delta z$ between the upper step cover 30 and the lower step cover 32, from the minimum permissible size value L0−d to the maximum permissible size value L0+d of the step height.

Although, in FIGS. 1 and 2, the upper step cover 30 is provided with the insertion opening 36 and the lower step cover 32 is provided with the guiding member 38, this embodiment is not limiting. In short, the configuration only has to be able to adjust the relative distance $\Delta z$ between the upper step cover 30 and the lower step cover 32. For example, the upper step cover 30 may be provided with the guiding member 38, and the lower step cover 32 may be provided with the insertion opening 36. In this case, the height L2 of the guiding member 38 indicates the height from the bottom surface 31 of the upper step cover, while the maximum length L1 of the connecting member 40 indicates the height from the bottom surface 31 of the upper step cover 30 to the bottom surface 33 of the lower step cover 32.

Figure 3:
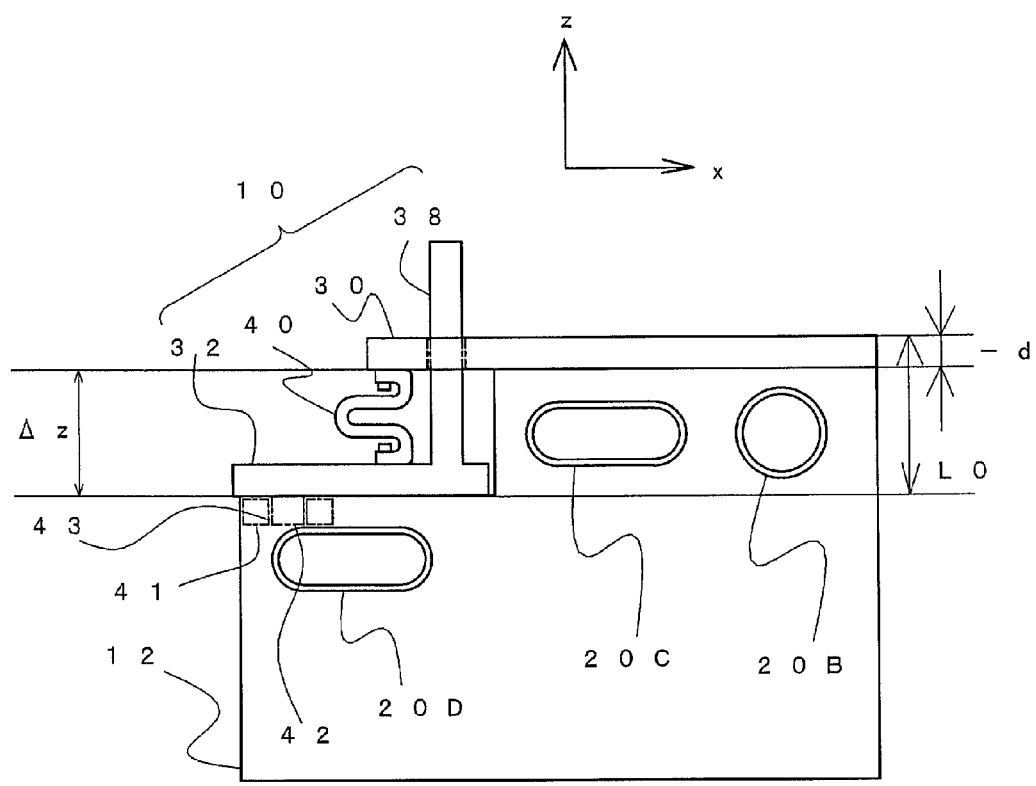
FIG. 3 shows the terminal cover according to the present embodiment which is attached to the casing.

Next, attachment of the terminal cover 10 according to the present embodiment to the casing 12 will be described. As shown in FIG. 2, when the step height of the casing 12 is the maximum permissible size value L0+d, the relative distance $\Delta z$ between the upper step cover 30 and the lower step cover 32 is adjusted to be the maximum permissible size value L0+d of the step height. In doing so, it is possible to fix the upper step cover 30 to the upper step surface 14 of the casing 12 and fix the lower step cover 32 to the lower step surface 16 of the casing 12. Similarly, as shown in FIG. 3, when the step height of the casing 12 is the minimum permissible size value L0−d, the relative distance $\Delta z$ between the upper step cover 30 and the lower step cover 32 is adjusted to the minimum permissible size value L0−d of the step height. In doing so, it is possible to fix the upper step cover 30 to the upper step surface 14 of the casing 12 and fix the lower step cover 32 to the lower step surface 16 of the casing 12. As such, because the terminal cover 10 of the present embodiment can change the relative distance in the step height direction between the upper step cover 30 and the lower step cover 32, it is possible to accommodate the dimensional tolerance of the casing 12 in the step height to thereby cover the upper step surface 14 and the lower step surface 16 of the casing 12.

Figure 4:
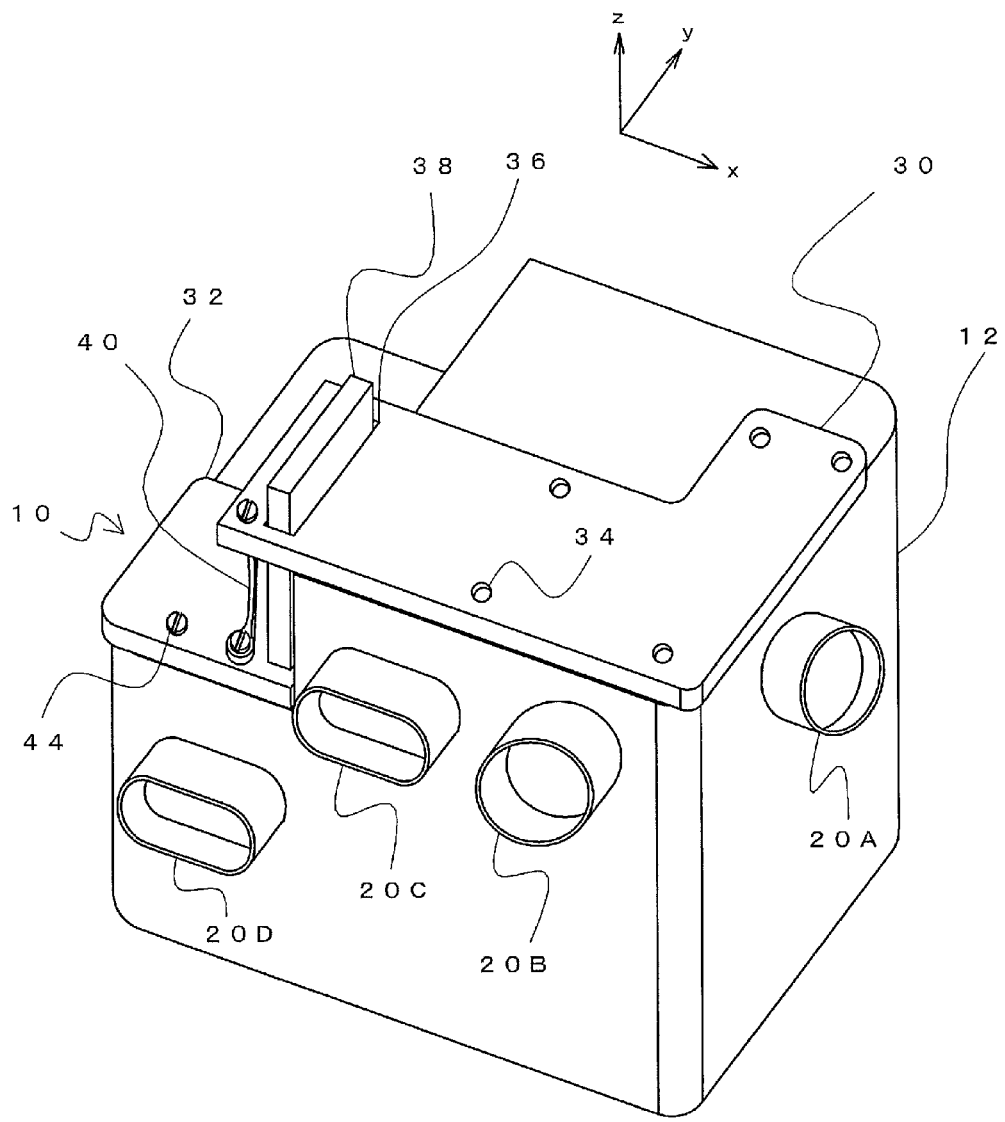
FIG. 4 shows the terminal cover according to the present embodiment which is attached to the casing.

Further, the terminal cover 10 according to the present embodiment has a configuration for preventing one of the tool insertion openings 22A to 22D from being exposed when the interlocking device 41 does not work. This configuration will be described below. In the following description, it is assumed that the interlock key 42 is provided on the lower step cover 32. As shown in FIG. 4, the lower step cover 32 is fixed to the lower step surface 16 by fastener members 44 such as screws, while the fastener members 44 are removed from the upper step cover 30. In this case, it is impossible to lift the upper step cover 30 higher than the maximum length L1 of the connecting member 40 in the step height direction (z direction in FIG. 4). Meanwhile, the length L2 in the step height direction of the guiding member 38 is equal to or greater than the maximum length L1 of the connecting member 40. As a result, it is impossible to take off the upper step cover 30 from the guiding member 38. In addition, because the insertion opening 36 and the guiding member 38 have a rectangular shape, it is impossible to expose the tool insertion openings 22A to 22C by rotationally moving the upper step cover 30 on the x-y plane. Further, because, as described above, the mechanical strength of the guiding member 38 is determined so that the guiding member 38 does not bend even when the operator or the like applies a load, it is impossible to bend the guiding member 38 to flip over the upper step cover 30 with respect to the upper step surface 14 of the casing 12. Ultimately, none of the tool insertion openings 22A to 22D are exposed unless the fastener members 44 connected to the lower step cover 32 are removed and the upper step cover 30 and the lower step cover 32 are removed together. When the lower step cover 32 is removed, the interlock key 42 provided on the lower step cover 32 is pulled off from the key insertion opening 43 of the interlocking device 41, thereby activating the interlocking device. As such, with the terminal cover 10 according to the present embodiment, when one of the tool insertion openings 22A to 22D is exposed, the interlocking device 41 is activated to thereby cut off power supply to the high-voltage device. With this, it is possible to ensure safety of the worker who inserts the tool into the tool insertion openings 22A to 22D to perform maintenance and inspection, etc.

Although, in the above-described embodiment, the cross-sectional shape of the insertion opening 36 and the guiding member 38 is rectangular, this shape is not limiting. In short, the configuration only has to be able to prevent the upper step cover 30 from rotationally moving on the x-y plane. A desired noncircular shape may be adopted in place of the rectangular shape. Further, a plurality of insertion openings 36 may be provided in order to prevent the upper step cover 30 from rotationally moving. In the latter case, the cross-sectional shape of the insertion openings 36 and the guiding members 38 may be circular or noncircular.

Figure 5:
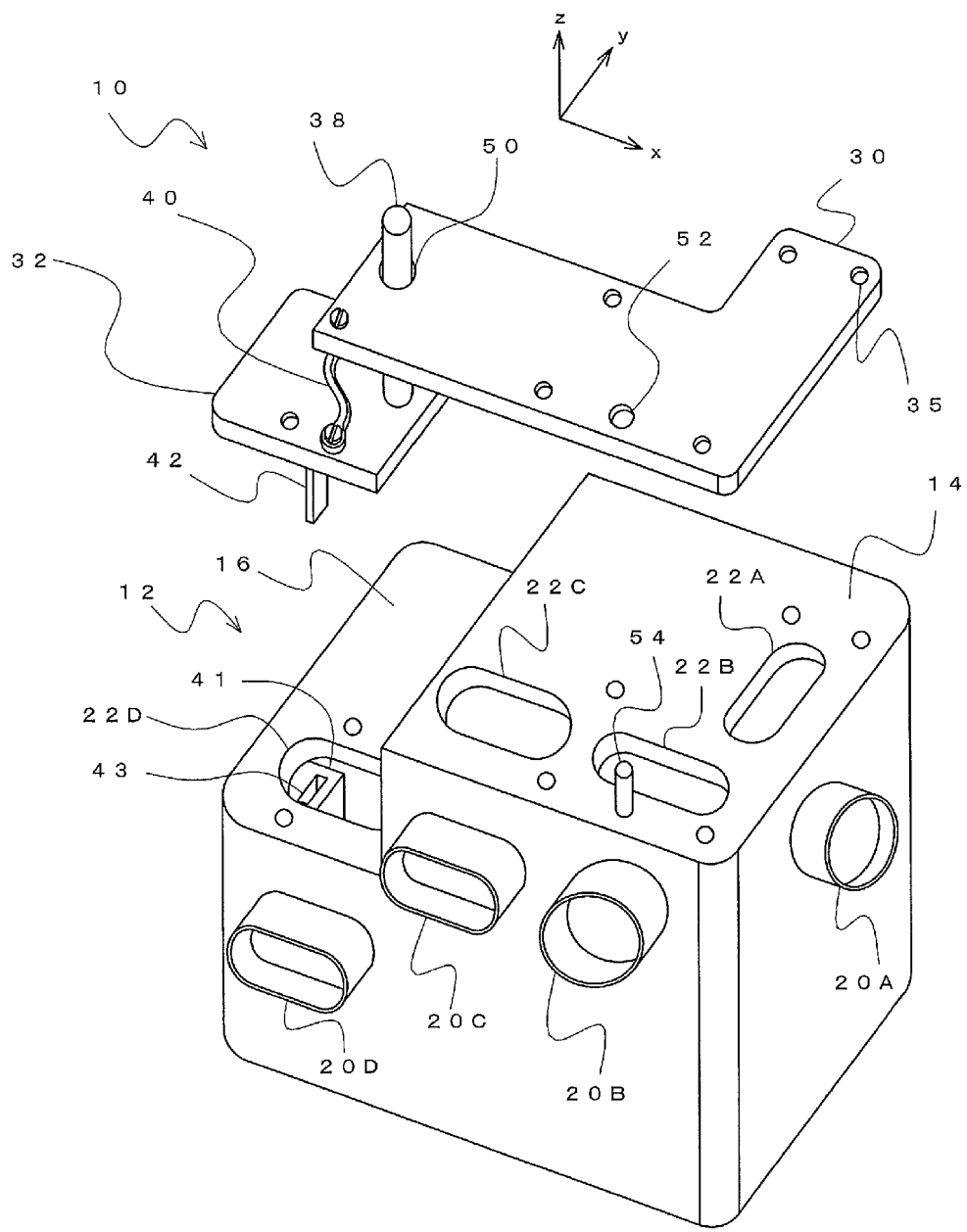
FIG. 5 shows an example of a terminal cover according to another embodiment.
Figure 6:
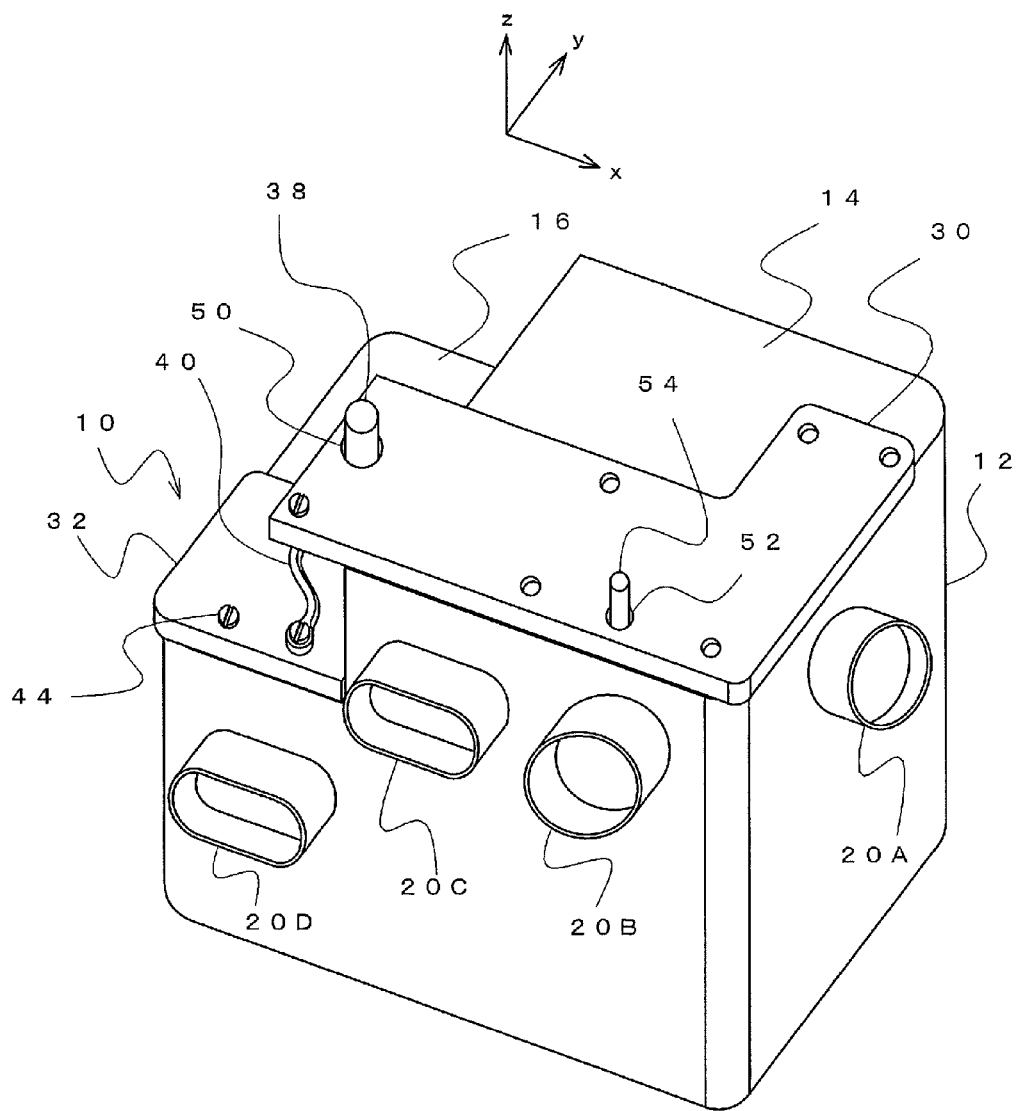
FIG. 6 shows the terminal cover according to another embodiment which is attached to the casing.

FIG. 5 shows an embodiment in which a plurality of insertion openings 36 are provided. The upper step cover 30 of the terminal cover 10 is provided with a first insertion opening 50 and a second insertion opening 52. The guiding member 38 is inserted into the first insertion opening 50. In addition, a detent pin 54 is provided on the upper step surface 14 of the casing 12 at a position corresponding to the second insertion opening 52, and as shown in FIG. 6, the detent pin 54 is inserted into the second insertion opening 52. Although, in the embodiment shown in FIGS. 5 and 6, the second insertion opening 52 is provided in the upper step cover 30, this configuration is not limiting. In short, the second insertion opening 52 and the detent pin 54 only have to be provided on the side on which the interlock key 42 and the key insertion opening 43 are not provided. For, example, it is also possible to provide the key insertion opening 43 in one of the tool insertion openings 22A to 22C in the upper step surface 14 and the interlock key 42 on the upper step cover 30, while providing the second insertion opening 52 in the lower step cover 32 and the detent pin 54 on the lower step surface 16.

Figure 7:
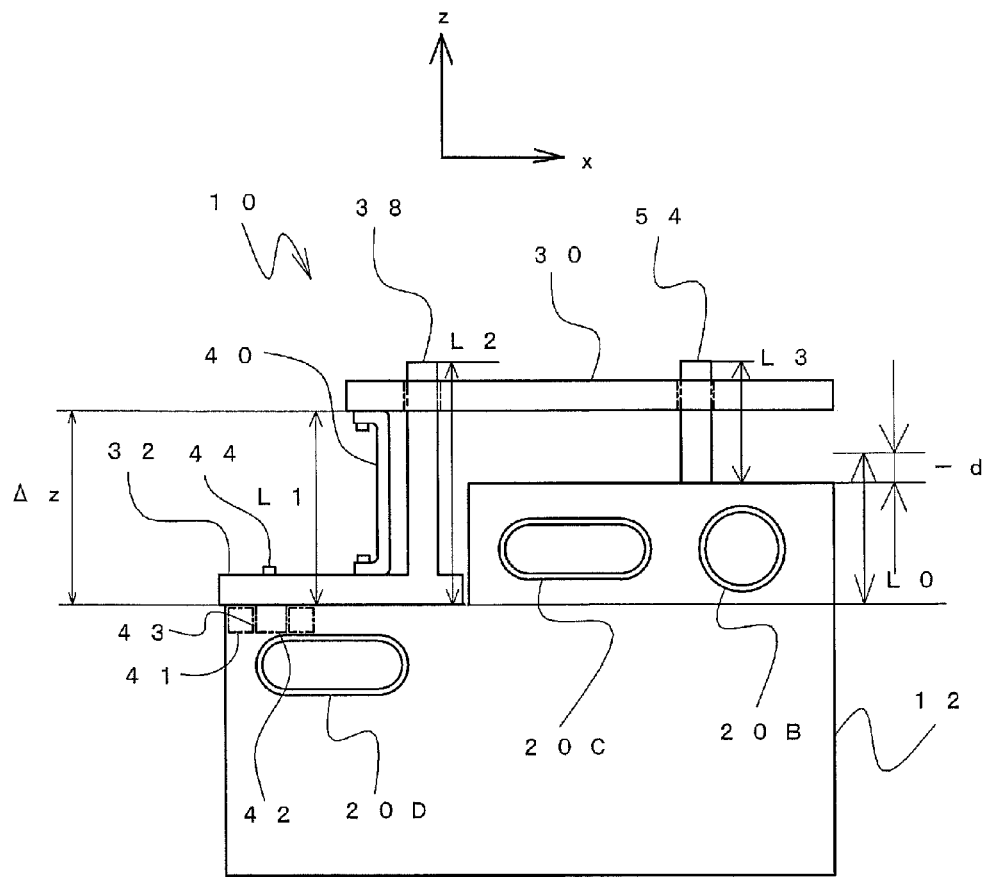
FIG. 7 shows the terminal cover according to another embodiment which is attached to the casing.
Figure 8:
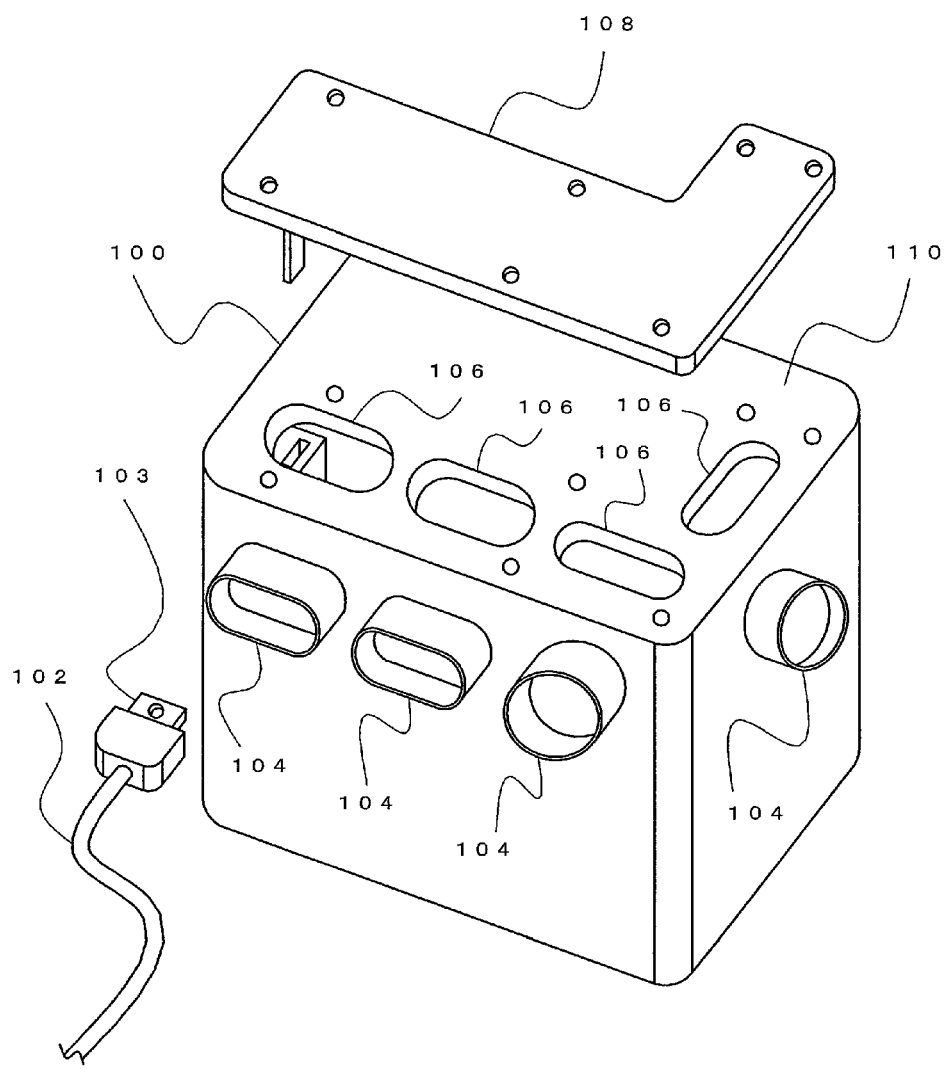
FIG. 8 shows an example of a conventional casing.
Figure 9:
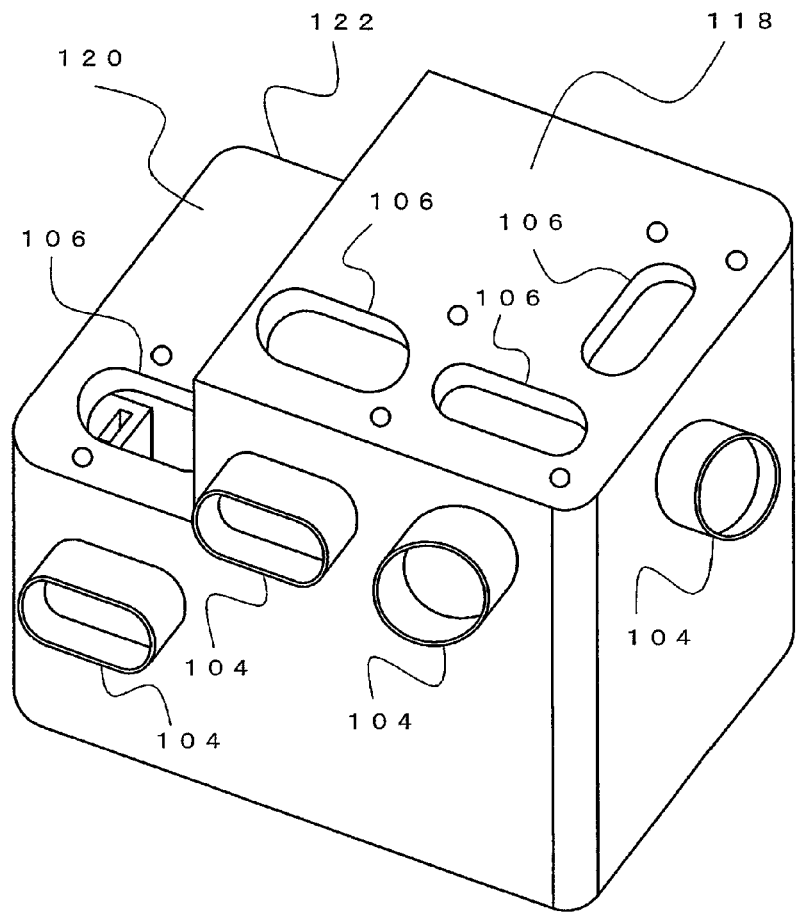
FIG. 9 shows an example of a miniaturized casing.
Figure 10:
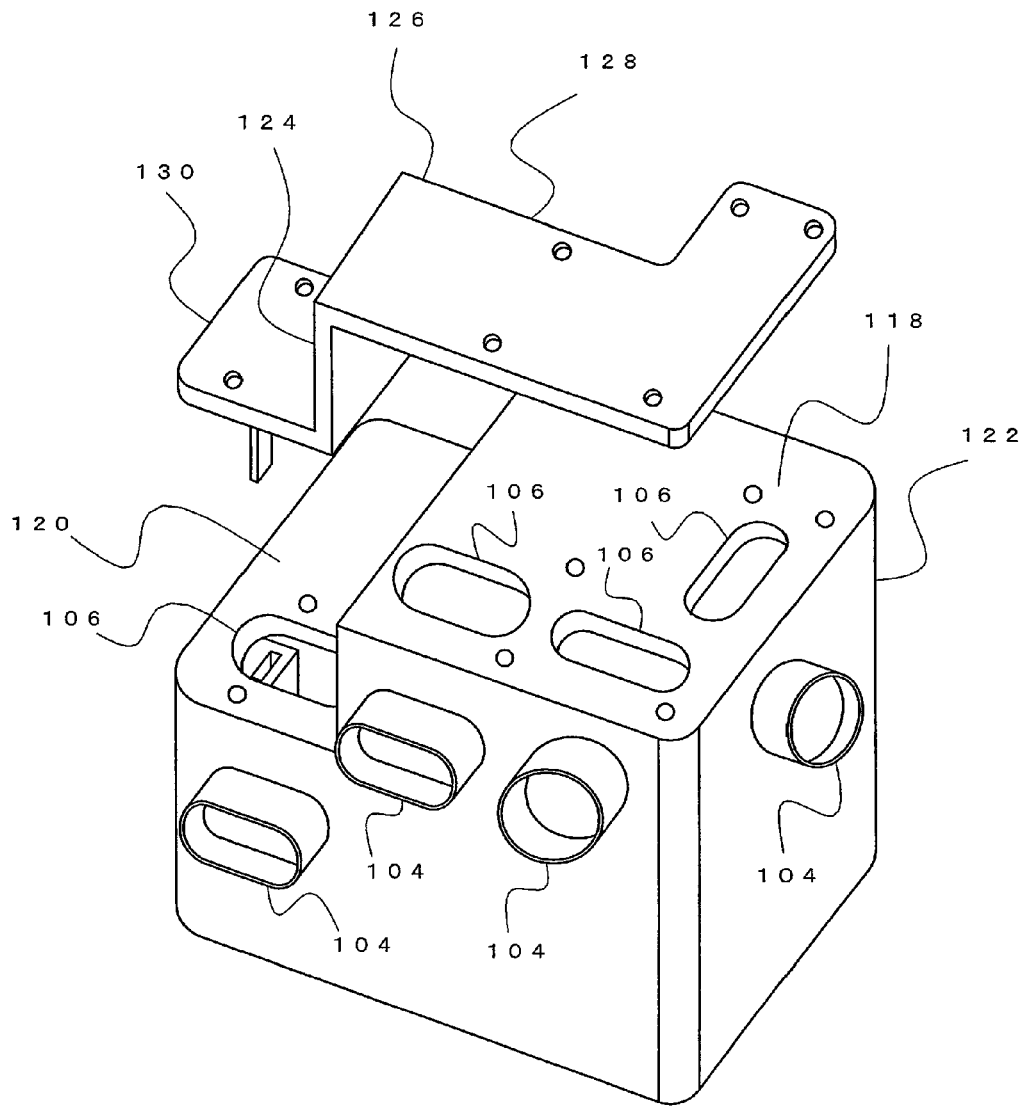
FIG. 10 shows an example of a step-shaped terminal cover.
Figure 11:
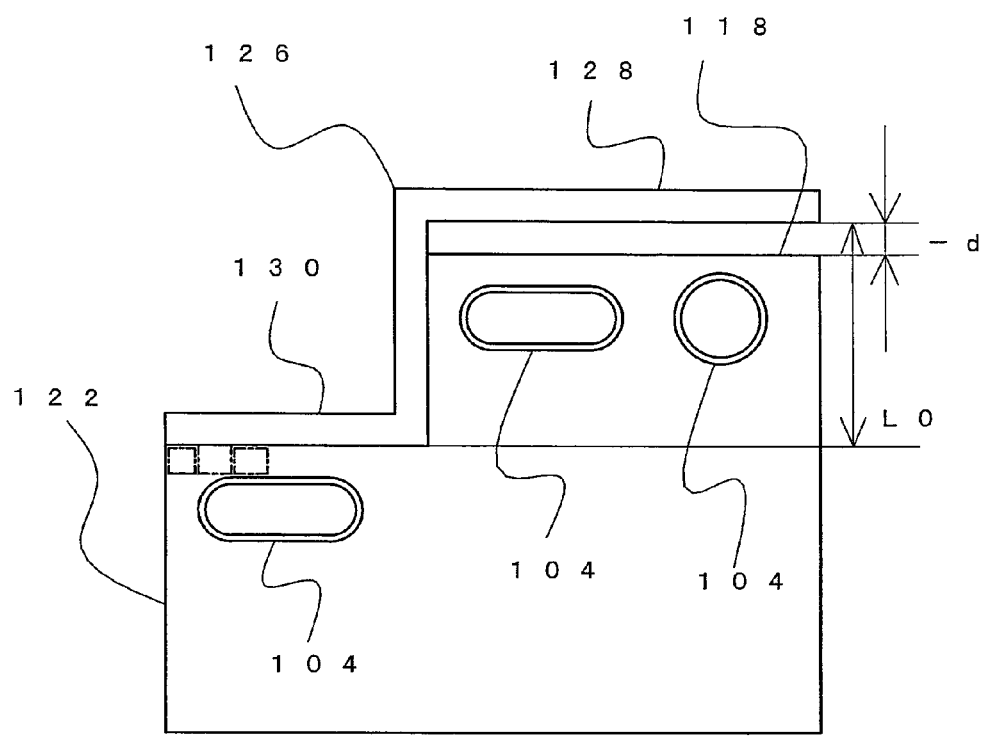
FIG. 11 shows the step-shaped terminal cover attached to the casing.
Figure 12:
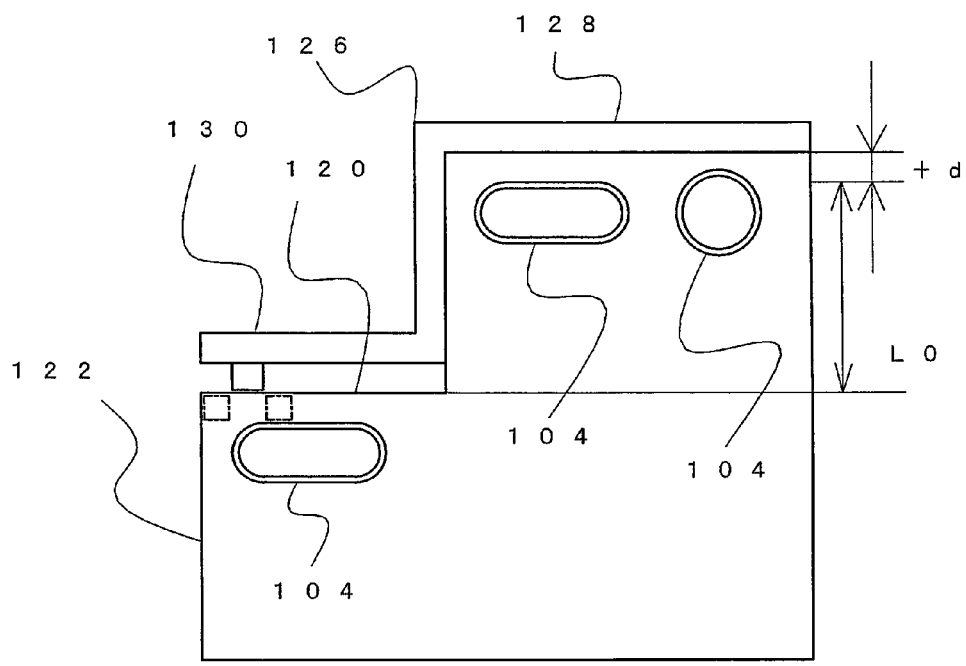
FIG. 12 shows the step-shaped terminal cover attached to the casing.

The detent pin 54 extends from the upper step surface 14 of the casing 12 in the step height direction (z axis direction in FIGS. 5 and 6), and the length L3 of the detent pin 54 in the step height direction is determined so that the detent pin 54 does not fall out from the second insertion opening 52 even when the relative distance Δz between the upper step cover 30 and the lower step cover 32 is maximum. Specifically, as shown in FIG. 7, the length L3 of the detent pin 54 in the step height direction is determined so as to be greater than a difference between the maximum length L1 of the connecting member 40 and the minimum permissible size value L0−d of the step height of the casing 12 (L3>L1−(L0−d)).

The upper step cover 30 is prevented from rotationally moving by cooperation between the detent pin 54 and the guiding member 38. Like FIG. 4, FIG. 6 and FIG. 7 show that the fastener members 44 of the upper step cover 30 are removed, while the lower step cover 32 is fixed on the lower step surface 16 by the fastener members 44. As shown in FIG. 7, as the relative distance Δz between the upper step cover 30 and the lower step cover 32 is limited by the connecting member 40, it is impossible to separate the upper step cover 30 from the lower step cover 32 further than L1. Meanwhile, the sum of the length L3 of the detent pin 54 and the minimum permissible size value L0−d of the step height of the casing 12 is designed to be greater than the maximum length L1 of the connecting member 40. Therefore, it is impossible to pull out the detent pin 54 from the second insertion opening 52. As described above, it is also impossible to pull out the guiding member 38 from the first insertion opening 50. As a result, rotational movement of the upper step cover 30 is limited by the guiding member 38 and the detent pin 54.

REFERENCE SIGN LIST 10 terminal cover, 12 casing, 14 casing upper step surface, 16 casing lower step surface, 18 step surface, 20 cable insertion opening, 22 tool insertion opening, 30 upper step cover, 31 upper step cover bottom surface, 32 lower step cover, 33 lower step cover bottom surface, 34 casing side fixing hole, 35 terminal cover side fixing hole, 36 insertion opening, 38 guiding member, 40 connecting member, 41 interlocking device, 42 interlock key, 43 key insertion opening, 44 fastener member, 50 first insertion opening, 52 second insertion opening, 54 detent pin.

The invention claimed is:

1. A container for accommodating a high-voltage device therein, the container comprising: a casing having openings in an upper step surface and a lower step surface connected by a step;
   an upper step cover which is larger than the openings in the upper step surface, and mounted on the upper step surface to cover the openings;
   a lower step cover which is larger than the openings in the lower step surface, and mounted on the lower step surface to cover the openings; and
   a connecting member which connects the upper step cover to the lower step cover, wherein:
   a step height between the upper step surface and the lower step surface falls between a maximum permissible size value and a minimum permissible size value,
   an insertion opening penetrating in a direction of the step height of the casing is formed in one of the upper step cover and the lower step cover;
   a guiding member which is to be inserted into the insertion opening and has a length in the step height direction of the casing longer than the maximum permissible size value of the step height of the casing is provided in another one of the upper step cover and the lower step cover; and
   the connecting member has a first end fixed to the upper step cover and a second end fixed to the lower step cover, and connects the upper step cover to the lower step cover to thereby prevent the guiding member from being pulled out from the insertion opening, while permitting change in a relative distance between the upper step cover and the lower step cover in the direction of the step height of the casing.

2. The container according to claim 1, wherein:
   an opening shape of the insertion opening is noncircular; and
   a cross-sectional shape of the guiding member in a direction perpendicular to the step height direction of the casing corresponds to the opening shape.

3. The container according to claim 1, wherein:
   a second insertion opening penetrating in the step height direction of the casing is formed in one of the upper step cover and the lower step cover, and
   a detent pin to be inserted into the second insertion opening is provided on one of the upper step surface and the lower step surface of the casing at a position corresponding to the second insertion opening.

* * * * *